United States Patent [19]

Sakurai

[11] Patent Number: 4,784,723
[45] Date of Patent: Nov. 15, 1988

[54] METHOD FOR PRODUCING A SINGLE-CRYSTALLINE LAYER

[75] Inventor: Junji Sakurai, Tokyo, Japan
[73] Assignee: Fujitsu Limited, Kawasaki, Japan
[21] Appl. No.: 837,318
[22] Filed: Mar. 3, 1986

Related U.S. Application Data

[63] Continuation of Ser. No. 483,132, Apr. 8, 1983, abandoned.

[30] Foreign Application Priority Data

Apr. 9, 1982 [JP] Japan ................................. 57-059249

[51] Int. Cl.$^4$ ............................................. C30B 13/22
[52] U.S. Cl. ...................... 156/620.73; 156/DIG. 88; 437/83
[58] Field of Search ................... 219/121 LE, 121 LF, 219/121 LU, 121 LV, 121 LS, 121 LW, 121 LM; 156/620.73, DIG. 88

[56] References Cited

U.S. PATENT DOCUMENTS

| | | | |
|---|---|---|---|
| 4,015,100 | 3/1977 | Gnanamuthu | 219/121 LF |
| 4,059,461 | 11/1977 | Fan et al. | 148/1.5 |
| 4,177,372 | 12/1979 | Kotera et al. | 156/617 R |
| 4,196,041 | 4/1980 | Baghdadi et al. | 156/620 |
| 4,281,030 | 7/1981 | Silfuast | 219/121 LM |
| 4,371,421 | 2/1983 | Fan et al. | 156/624 |
| 4,406,709 | 9/1983 | Celler et al. | 148/1.5 |
| 4,415,794 | 11/1983 | Delfino et al. | 219/121 LW |
| 4,444,620 | 4/1984 | Kovas et al. | 156/647 |
| 4,466,179 | 8/1984 | Kasten | 29/576 T |
| 4,737,233 | 4/1988 | Kamgar et al. | 156/620.73 |

FOREIGN PATENT DOCUMENTS

| | | | |
|---|---|---|---|
| 0071471 | 2/1983 | European Pat. Off. | |
| 970859 | 9/1958 | Fed. Rep. of Germany. | |
| 53-5496 | 1/1978 | Japan | 219/121 LF |
| 56-142630 | 7/1981 | Japan | 29/576 T |
| 56-80138 | 7/1981 | Japan. | |
| 57-162433 | 6/1982 | Japan | 29/576 T |
| 92831 | 9/1982 | Japan | 29/576 T |
| 57-183023 | 11/1982 | Japan | 29/576 T |

OTHER PUBLICATIONS

Gutfeld, IBM Tech. Disc. Bull., vol. 19, No. 10, Mar. 1977, pp. 3955-3956.
Gutfeld, "Crystallization of Silicon for Solar Cell Applications", IBM Technical Disclosure Bull., vol. 19, No. 10, 3/77.

Primary Examiner—Olik Chaudhuri
Attorney, Agent, or Firm—Staas & Halsey

[57] ABSTRACT

A method of producing a semiconductor device includes the steps of preparing a base body, forming a non-single-crystalline semiconductor layer on the base body, and irradiating the non-single-crystalline semiconductor layer with an energy beam having a strip shaped irradiation region, in such a manner that either the base body or the energy beam is moved in a direction other than a scanning direction of the energy beam.

8 Claims, 4 Drawing Sheets

METHOD FOR PRODUCING A SINGLE-CRYSTALLINE LAYER

This is a continuation of co-pending application Ser. No. 483,132, filed on Apr. 8, 1983, now abandoned.

BACKGROUND OF THE INVENTION

1. Field of the Invention

The present invention relates to a method for producing a semiconductor device, more particularly to a method for producing a single crystalline layer in a semiconductor device.

2. Description of the Prior Art

Semiconductor devices having a silicon-on-insulating-substrate (SOIS) structure, have become a focus of attention in the art as they are optimal for forming a high density of elements and enable high-speed element operation.

In a semiconductor device having an SOIS structure, non-single-crystalline silicon formed on an insulating layer or other insulating substrate is single-crystallized by melting. Then, an element having a transistor, resistance, or other function is formed on the single-crystallized silicon layer.

In the process for single-crystallization of the non-single-crystalline silicon layer, a beam irradiation process is often used. The conventional method, however, has problems with the quality of the obtained single-crystalline silicon layers Therefore, both the electrical properties and production yield of semiconductor devices formed on the single-crystalline silicon layers are reduced.

SUMMARY OF THE INVENTION

It is an object of the present invention to provide a method for producing a single crystalline layer from a non-single-crystalline layer during the production steps of a semiconductor device.

It is another object of the present invention to provide a heat treatment method for single crystallization to improve the electrical properties and the yield of the semiconductor device.

According to the present invention, there is provided a method for producing a semiconductor device comprising the steps of preparing a base body, forming a non-single-crystalline semiconductor layer on the base body and irradiating the non-single-crystalline semiconductor layer with an energy beam having a strip shaped irradiation region, in such a manner that either one of the base body of the energy beam is moved in a direction other than a scanning direction of the energy beam.

Other objects and advantages of the present invention will become apparent from the following description of embodiments with reference to the prior art and the accompanying drawings.

DESCRIPTION OF THE PREFERRED EMBODIMENTS

Before describing the preferred embodiments, a discussion will be made of the conventional method and its attendant problems.

Figure 1A:
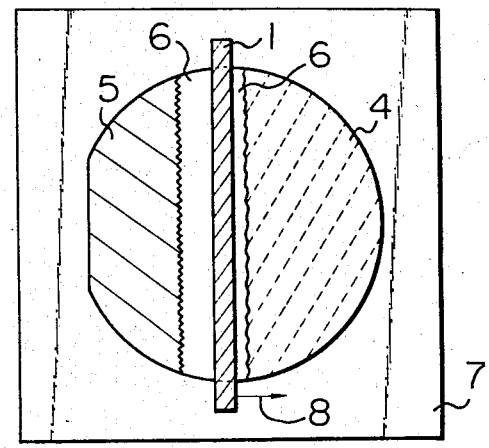
FIG. 1A is a schematic top plan view of a prior art device.
Figure 1B:
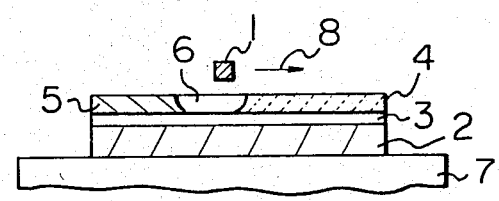
FIG. 1B is a cross-sectional view of FIG. 1A.

FIGS. 1A and 1B schematically show a conventional infrared ray heating process in which a non-single-crystalline silicon layer is changed to a single-crystalline silicon layer.

As shown in FIGS. 1A and 1B, a carbon strip heater 1, which has a strip shaped irradiation region, is heated at a temperature of 1500° C. to 1600° C. and is supported near the upper surface of a polycrystalline silicon layer 4 formed on, for example, a silicon dioxide layer 3 on a silicon substrate 2. The silicon substrate 2 or the carbon heater 1 is moved transversely with respect to the axis of the carbon strip heater 1. A band shaped infrared ray beam, irradiated from the carbon heater 1, is scanned onto a portion of the polycrystalline silicon layer 4 into the direction marked by reference numeral 8 to gradually melt the polycrystalline silicon layer 4. According to the present invention the energy beam is selected from a group comprising an infrared ray beam, a visible ray beam and an ultraviolet ray beam. The melted silicon liquid 6 is recrystallized to form a single-crystallized silicon layer 5. A preliminary heater 7 heats the silicon substrate 2 and the polycrystalline silicon layer 4 uniformly.

Figure 2:
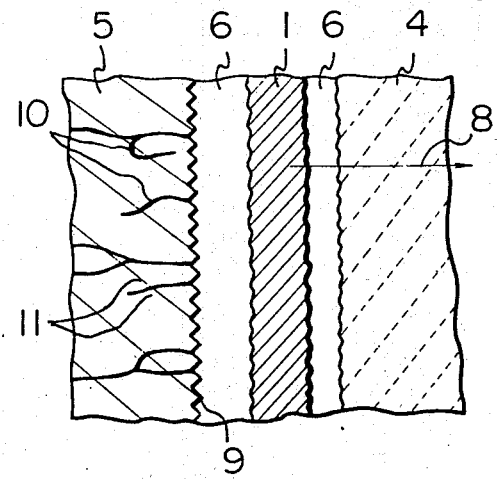
FIG. 2 is a schematic view of conventional single crystallization.

If the carbon strip heater 1 gives off an uneven temperature of if it has even a slight unevenness on its surface, a boundary surface 9 between the silicon liquid 6 and the single-crystalline layer 5 becomes zigzagged, as shown in FIG. 2. This results in the formation of small angle grain-boundaries 10 and twin crystal regions 11 at a plurality of the uneven points of the boundary surface 9. This affects the quality of the obtained single crystalline silicon layer and, therefore, the electrical properties and production yield of the semiconductor device using the single-crystalline silicon layer as an element forming substrate.

Figure 3A:
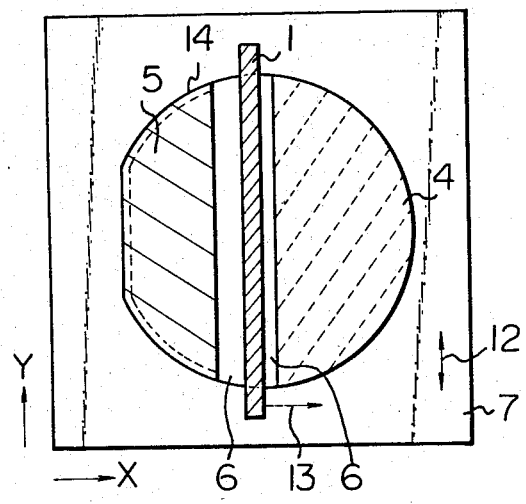
FIG. 3A is a schematic top plan view in accordance with the present invention.
Figure 3B:
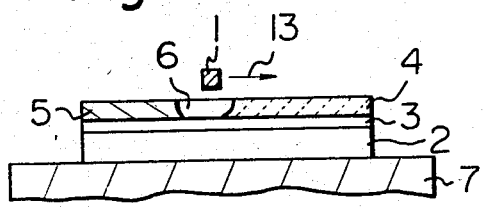
FIG. 3B is a cross-sectional view of FIG. 3A.

Now, a description will be given of the preferred embodiments of the present invention. Referring to FIGS. 3A and 3B, a substrate to be treated is horizontally mounted on a heated XY stage 7. A silicon dioxide (SiO$_2$) insulating layer 3 having a thickness of approximately 1 to 2 μm (microns) is formed on a silicon substrate 2. A polycrystalline silicon layer 4 is formed, by chemical vapor deposition, on the silicon dioxide insulating layer 3. A bar-shaped carbon heater 1, heated to a temperature of 1500° C. to 1600° C., is supported at a position 1 mm from the upper surface of the substrate to be treated, i.e., the surface of the polycrystalline silicon layer 4.

A band-shaped infrared ray beam from the bar-shaped carbon heater 1 is scanned in the X axial direction at a speed of approximately 1 mm per second on the polycrystalline silicon layer 4 to melt the layer 4 and recrystallize it to form a single-crystallized silicon layer 5.

During the scanning, the substrate to be treated and the carbon heater 1 are relatively oscillated in the direction Y of the carbon heater 1 at a frequency of 1 KHz and an amplitude of 1 mm. It is preferable that the oscillating speed be larger than at least 10 times the beam scanning speed. Further it is preferable that the amplitude of the oscillation range from 50 μm to 50 mm. For the oscillation and scanning, either the substrate or the carbon heater 1 may be moved.

The repeated movement of the beam over the same surface portion of the polycrystalline silicon layer 4 by the relative oscillation between the carbon heater 1 and the substrate prevents any unevenness of the temperature of the carbon heater 1 or unevenness of the surface of the carbon heater 1 and produces a uniform temperature distribution in the silicon liquid 6. This results in an improved single-crystallized silicon layer 5 which does not include small-angle grain-boundaries or twin crystal regions anywhere except for a circumferential edge portion 14 where grain boundaries are formed.

Figure 4:
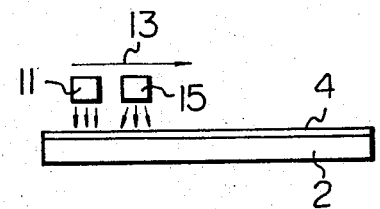
FIG. 4 is a schematic view of a process for heat treatment of a polycrystalline silicon layer using a main heater and an additional heater.

As shown in FIG. 4 according to the present invention, two carbon strip heaters 11 and 15 may be used in place of a single carbon heater 1. The additional carbon heater 15 preliminarily heats a region, adjacent to where the main carbon strip heater 11 uniformly heats the polycrystalline silicon layer, at a temperature a little lower than the melting point of silicon. Provision of the additional carbon strip heater 15 in front of the main carbon strip heater 11 increases the uniform heating effect of the main carbon strip heater 11 on the polycrystalline silicon layer 4. In the figure, the arrow mark 13 shows the scanning direction.

Figure 5:
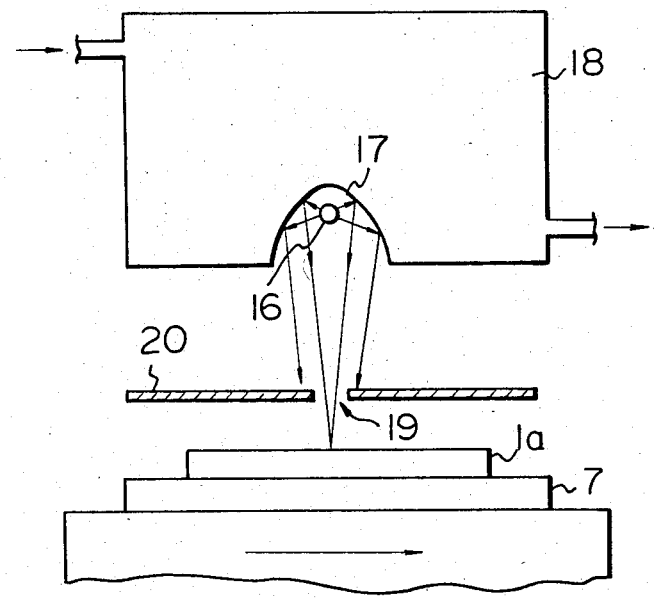
FIG. 5 is a schematic crss-sectional view of a process for heating a polycrystalline silicon layer by a lamp.

It is preferable that the polycrystalline silicon layer 4 be heated in such a manner that the center surface of the polycrystalline silicon is cooled earlier than the circumference of the polycrystalline silicon. Such a heating process allows single crystallization to occur from the center portion of the circumference of the polycrystalline silicon layer 4. This enables an entirely uniform single-crystallized silicon layer across the silicon wafer to be obtained. A tungsten lamp may be used in place of a carbon strip heater, as shown in FIG. 5. A beam irradiated from the tungsten lamp 16 is reflected by a mirror 17, made of gold-plated aluminum or the like, to heat a slicon wafer 1a on a preliminarily heated stage 7, through a bar-shaped slit formed in a slit plate 20. The mirror 17 is cooled by a water tank 18. The arrow mark shows the flow of water.

Figure 6:
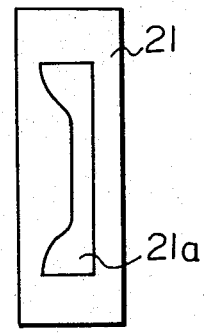
FIG. 6 is a cross-sectional view of a slit plate according to the present invention.

In the above heating process, the slit plate 20 may be placed by a split 21 having a slit 21a, as shown in FIG. 6. The slit plate 21 enables heating of the wafer, including the polycrystalline silicon layer, to be carried out in such a manner that a center portion of the wafer is cooled earlier tha the circumferential portion, again resulting in an entirely uniform single-crystallization.

Figure 7:
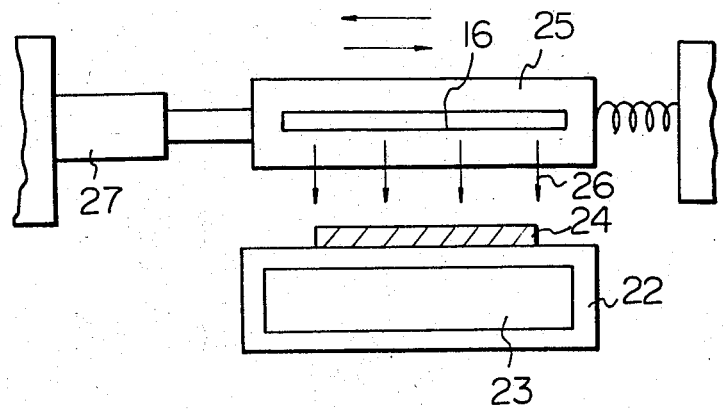
FIG. 7 is a schematic cross-sectional view for explaining the oscillation process according to the present invention.

FIG. 7 is an example of the oscillating device used in the present invention. In this case, the heater is a tungsten lamp 16 provided in a lamp chamber 25. The chamber 25 is oscillated by an ultrasonic vibrator 27. The beam 26 from the lamp 16 oscillates when irradiating a wafer 24 positioned on a hot stage 22 heated by a heater 23.

Figure 8:
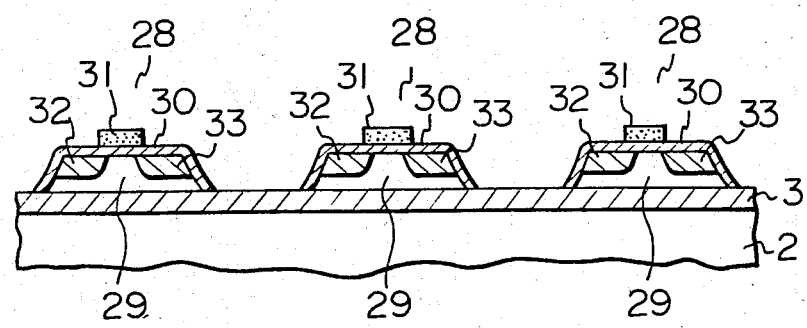
FIG. 8 is a cross-sectional view of a semiconductor device produced by the present invention.

The process of forming a semiconductor, e.g., one having a metal oxide semiconductor (MOS) transistors, after forming the single-crystallized layer, is shown in FIG. 8. Boron ions, for example, are implanted in a single-crystallized silicon layer 29 formed on the silicon dioxide layer 3 on the single-crystalline silicon wafer 2 and annealed to form a P-type single-crystallized silicon layer 29. Then, a plurality of mesa-type silicon islands 28, comprising the P-type single-crystallized silicon layer, are formed by separating the P-type single-crystallized silicon layer into a plurality of regions by either a well-known etching or selective oxidation process. Then, a gate oxidation film 30 is formed on the silicon islands 28 by a thermal oxidation process or the like. After that, polycrystalline silicon gate electrodes 31 are formed on the gate oxidation film 30 by a chemical vapor deposition process and etching process. Arsenic ions are then selectively implanted into the P-type single crystallized silicon layer using the silicon gate 31 as a masking film. After that, the implanted portion is annealed to obtain N+-type source regions 32 and N+-type drain regions 33. Thus, after metallization and passivation, a semiconductor IC having an SOIS structure having a MOS transistor can be completed.

I claim:

1. A method of producing a single crystalline layer for use in a semiconductor device including a stage which moves in a first direction and using an energy source emitting an energy beam having a strip shaped irradiation region, said method comprising the steps of:
   (a) preparing a base body;
   (b) forming a non-single crystalline semiconductor layer on the base body;
   (c) irradiating the non-single-crystalline semiconductor layer with the energy beam for melting the non-single crystalline semiconductor layer, the energy source oscillating at a frequency which is approximately ten times greater than the scanning speed of the energy beam and in a horizontal direction which is perpendicular to a scanning direction of the energy beam and being stationary with respect to the first direction; and
   (d) recrystallizing the melted non-single crystalline semiconductor layer for forming a single crystalline semiconductor layer as a substrate for the semiconductor device.

2. A method according to claim 1, wherein the oscillating energy beam has an amplitude of oscillation ranging from 50 μm to 5 mm.

3. A method according to claim 1, wherein said step (c) comprises selecting the energy beam from the group consisting of an infrared ray beam, a visible ray beam and an ultraviolet ray beam.

4. A method according to claim 1, wherein said oscillating speed is approximately 1 KHz.

5. A method of producing a single crystalline layer for use in a semiconductor device having a base body on a stage moving in the X-direction and using an energy source emitting an energy beam having a strip shaped irradiation pattern, said method comprising the steps of:
   (a) forming a polycrystalline semiconductor layer on the base body;
   (b) irradiating the polycrystalline semiconductor layer with the energy beam having the strip shaped irradiation pattern for melting the polycrystalline semiconductor layer, the energy source being stationary in the X-direction but oscillating at a frequency which is approximately ten times greater than a scanning speed of the energy beam in the Y-direction; and (c) recrystallizing the melted polycrystalline semiconductor layer for forming a single crystalline semiconductor layer.

6. A method of producing a single crystalline layer for use in a semiconductor device having a semiconductor substrate placed on a stage and an insulating layer formed on the semiconductor substrate and using an energy source emitting a strip shaped beam, said method comprising the steps of:
   (a) forming a polycrystalline silicon layer on the insulating layer; and
   (b) irradiating the polycrystalline silicon with the strip shaped energy beam scanned in a first direction to form a single crystalline region, including the substep of:
      (i) oscillating the stage having the semiconductor substrate thereon in a second direction which is perpendicular in a horizontal direction to the first direction of the strip shaped energy beam.

7. A method according to claim 6, further comprising the step of irradiating the polycrystalline silicon layer with a second energy beam, which precedes the first energy beam, to heat the polycrystalline silicon layer.

8. A method according to claim 6, wherein said step (b) comprises oscillating the first energy beam at an amplitude from 50 $\mu$m to 5 mm.

* * * * *

UNITED STATES PATENT AND TRADEMARK OFFICE
CERTIFICATE OF CORRECTION

PATENT NO. : 4,784,723

DATED : NOVEMBER 15, 1988

INVENTOR(S) : JUNJI SAKURAI

It is certified that error appears in the above-identified patent and that said Letters Patent is hereby corrected as shown below:

```
Col. 1, line 31, "layers Therefore," should be --layers.
                  Therefore,--;
        line 52, "body of the" should be --body or the--.

Col. 2, line 4, "crss-" should be --cross- --;
        line 43, "of" should be --or--.

Col. 3, line 49, "slicon" should be --silicon--;
        line 54, "placed" should be --replaced--;
        line 54, "split 21" should be --slit plate 21--;
        line 58, "tha" should be --than--.
```

Signed and Sealed this

Fourteenth Day of March, 1989

Attest:

DONALD J. QUIGG

*Attesting Officer*  *Commissioner of Patents and Trademarks*